United States Patent [19]

Black et al.

[11] 4,320,365
[45] Mar. 16, 1982

[54] FUNDAMENTAL, LONGITUDINAL, THICKNESS MODE BULK WAVE RESONATOR

[75] Inventors: James F. Black, Newington, Conn.; Richard A. Courtney, Vienna, Va.; Thomas W. Grudkowski, Glastonbury, Conn.; Philip T. Norusis, Falls Church, Va.; Harry R. Wood, Gaithersburg, Md.

[73] Assignee: United Technologies Corporation, Hartford, Conn.

[21] Appl. No.: 203,211

[22] Filed: Nov. 3, 1980

[51] Int. Cl.³ .................. H03H 9/17; H03H 9/205; H03H 9/50; H03H 9/56
[52] U.S. Cl. ............................ 333/187; 333/189; 333/191
[58] Field of Search .................. 333/186–192; 310/311, 320–325, 328–334, 363–366

[56] References Cited

U.S. PATENT DOCUMENTS 3,401,275  9/1968  Curran et al. ............... 333/189 X
3,582,839  6/1971  Pim et al. ....................... 333/191
3,697,788  10/1972  Parker et al. .

Primary Examiner—Marvin L. Nussbaum
Attorney, Agent, or Firm—M. P. Williams

[57] ABSTRACT

A substrate (10) is thinned to provide a membrane (12) on which are disposed a counter electrode (20), a film of low conductivity piezoelectric material (22) and a top electrode (24) to form a half wavelength, bulk mode resonator employing a longitudinal acoustic wave. A second top electrode (25) provides a second resonator acoustically coupled to the first, to form a filter. Piezoelectric films include zinc oxide, and aluminum nitride; substrates include silicon and aluminum oxide. A buffer layer (18), such as silicon dioxide may assist in preventing surface aberations and providing proper crystallographic orientation.

9 Claims, 2 Drawing Figures

FUNDAMENTAL, LONGITUDINAL, THICKNESS MODE BULK WAVE RESONATOR

The invention described herein was made under or in the course of a contract with the U.S. Government.

DESCRIPTION

1. Technical Field

This invention relates to bulk wave resonators, and more particularly to improved resonators and filters employing longitudinal bulk acoustic waves operating in a fundamental (half wavelength) thickness mode.

2. Background Art

Technological advances in integrated circuit manufacturing processes and techniques have provided the capability for implementing systems and subsystems in microelectronic chips. Whereas the size of integrated circuits continues to diminish, the size of external resonators and filters, which may be used for frequency control in conjunction with integrated circuits, has not decreased accordingly. Therefore, the disparity in size between integrated circuits and related filters and resonators continues to increase. Additionally, there appears to be an ever increasing need for higher quality devices operating at carrier frequencies in the hundreds of megahertz frequency regime. Although higher frequencies may be achieved by use of frequency multipliers, the use of frequency multipliers, and the commensurately-required sideband and subharmonic filters, further aggravates the size disparity between resonators and filters and integrated circuits which they may be used with, as described hereinbefore.

To partially satisfy this need, there are a large number of crystal resonators known in the art. Some of these achieve the desired high frequencies (hundreds of megahertz) by working at a frequency which is an harmonic of the device fundamental frequency. However, if one uses the fourth harmonic, for instance, then one must separate it from the third and the fifth harmonics by means of band-pass filtering. On the other hand, use of the fundamental mode is desirable since many of the harmonics are not generated in fundamental mode devices, depending on the characteristics of the particular device, and such harmonics as are generated can be eliminated simply with low pass filtering. Additionally, the bandwidth of filters comprising resonators operating at harmonics is severely limited, due in part to the inefficiency of the higher ordered modes. Examples of higher order mode bulk wave resonators are described in Page, D. J., Proceedings IEEE, October 1968, pp. 1748, 1749 and Sliker, T. R., et al, Journal of Applied Physics, April 1967, pp. 2350-2358. The devices reported there employ a cadmium sulphide layer on top of silicon or quartz and require that the cadmium sulphide layer be a half wavelength at the desired frequency, there being additional half wavelengths in the underlying crystal substrate. These devices tend to have relatively low Q (resonant quality factor) and are reported to be difficult to produce in desired size ranges without additional problems such as acoustic scattering.

A more recent addition to the art is a fundamental mode resonator capable of operation in excess of 100 megahertz. These devices are formed by ion milling of lithium niobate or quartz crystals. In general, relatively good devices have been produced in this way. And, filters employing a pair of coupled resonators in the same crystal have been successfully fabricated. However, the utilization of lithium niobate or quartz does not foster the utilization of such filters with electronic devices that can be fabricated by normal semiconductor integrated circuit processing techniques on a single monolithic substrate. For providing two or more resonators on the same crystal so as to fabricate filters, it is necessary that the devices be capable of implementation in a closely spaced relationship in order to have an adequate coupling coefficient between resonators. The success of such devices may depend on the modes (shear or longitudinal) which are utilized. Although a shear mode would seem to lend itself to high coupling coefficients, the coupling coefficient between shear mode resonators in quartz has been reported to be in the range of 0.0001 to 0.001 (Sykes, R. A., et al, IEEE Convention Record 1967, pp 78-93).

In addition to compatibility with integrated circuit technology (semiconductor processing), desirable features of crystal resonator manufacturing processes include high repeatability of smooth parallel surfaces, desired thicknesses, and minimum conductivity of the piezoelectric material. Furthermore, the processes involved should be inexpensive and simple, and lend themselves to mass production.

DISCLOSURE OF INVENTION

Objects of the invention include provision of fundamental mode resonators and filters operable in the hundreds of megahertz regime, which are capable of being fabricated in a form compatible with semiconductor processing or other considerations, and which are readily fabricated utilizing mass production techniques on a reliably reproducible basis.

According to the present invention, a fundamental, longitudinal, thickness mode crystal resonator comprises a substrate having a thin diaphragm etched therein, a counter electrode disposed over the diaphragm, a thin film of highly piezoelectric, high resistivity material disposed over the secondary electrode, and a metal primary electrode disposed on the piezoelectric material. In accordance further with the invention, there are two metal electrodes disposed on the piezoelectric material in close proximity, whereby to provide two adjacent resonators which are mutually coupled to form a filter. According further to the invention, the piezoelectric material comprises zinc oxide. According to the invention still further, an isolation layer, such as silicon dioxide, may be disposed between the substrate and the counter electrode layer, thereby to provide crystallographic and/or chemical isolation between the secondary electrode and the substrate. In still further accord with the invention, the substrate may be silicon.

Resonators and filters incorporating the present invention may be fabricated utilizing batch processing techniques well known in the semiconductor integrated circuit industry. Many devices may be made on a single wafer, and such devices may be made directly on the same chips as are circuits to which such devices are to be connected for use. A variety of techniques for assuring the requisite characteristics of such devices may be employed, all of which are well known in the art, in the light of the teachings which follow hereinafter.

The foregoing and other objects, features and advantages of the present invention will become more apparent in the light of the following detailed description of exemplary embodiments thereof, as illustrated in the accompanying drawing.

BEST MODE FOR CARRYING OUT THE INVENTION

Figure 1:
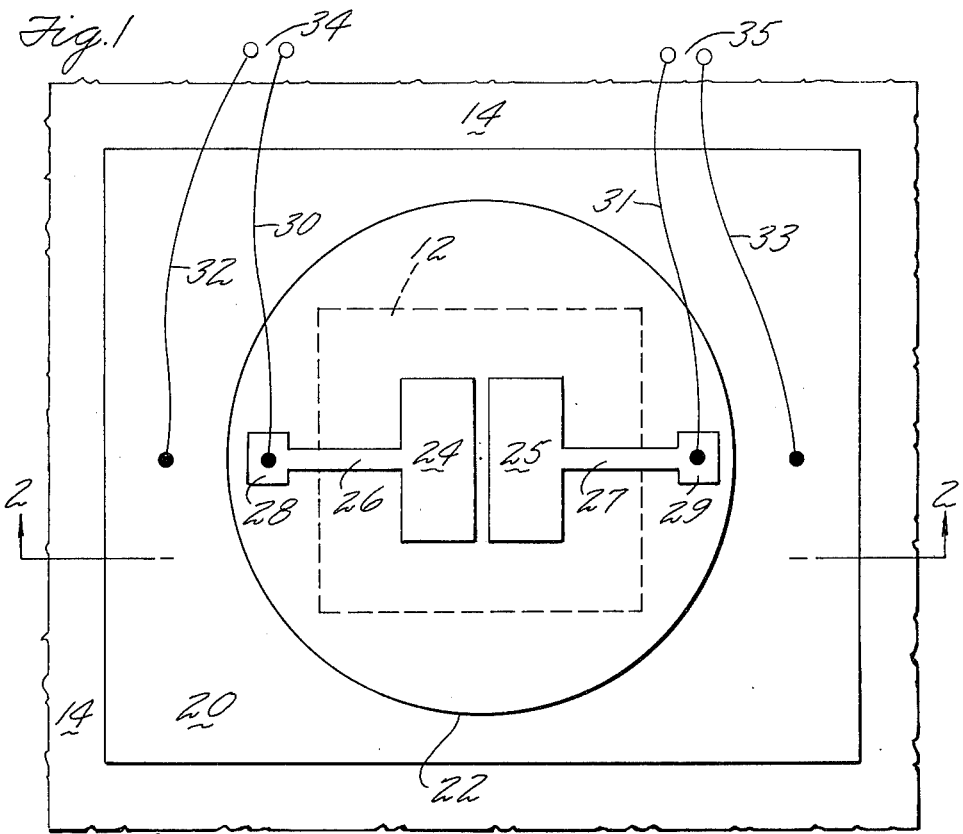
FIG. 1 is a plan view of an exemplary embodiment of the invention.
Figure 2:
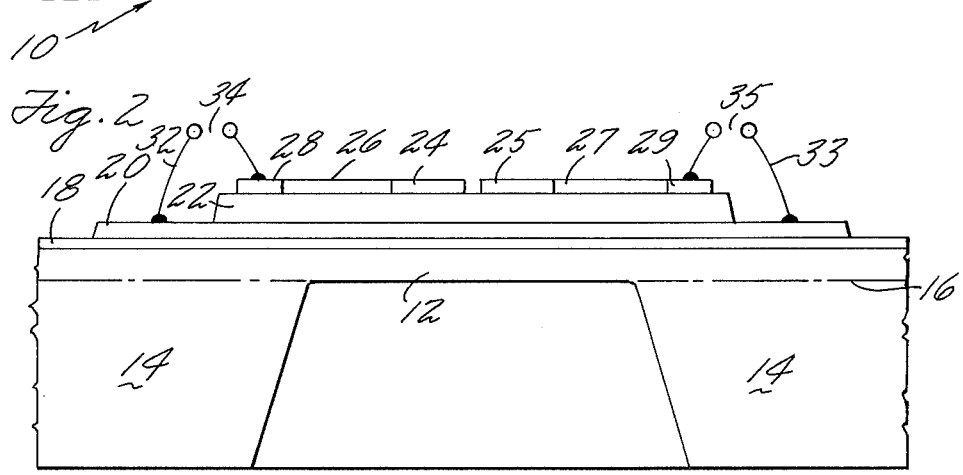
FIG. 2 is a sectioned side elevation view taken on the line 2—2 in FIG. 1.

Referring now to FIGS. 1 and 2, a single device 10 which incorporates the present invention is shown as it might appear after fabrication on a large wafer along with a number of other such devices, or circuits with which it may be related on the wafer. A silicon substrate 10 is etched to provide a thin membrane 12 surrounded by thicker regions 14 which provide support. Photolithographic masking and etching, well known in the semiconductor industry, may be used to provide the thin diaphragm 12. On the other hand, a chemical etch stop process, employing a solution of ethylene diamine-water-pyrocatechol, at a temperature near 105° C., may be utilized. This process is described in Bohg, A., Journal Electrochemical Society: Electrochemical Technology, February 1971, pp. 401, 402 and in Guckel, H., et al: Applied Physics Letters, Nov. 1, 1977, pp. 618, 619. This process involves the selective etching based upon the conductivity of the silicon, which etches free or lightly doped silicon at a relatively high rate (near 125 micron/hour), but is virtually incapable of attacking silicon having a doping density near $7 \times 10^{19}/cm^3$. In order to employ that process, it is necessary that the silicon substrate be prepared with the desired conductivity regions, including the region above the dot-dash line 16 in FIG. 2, which is heavily doped and the region below that line which is lightly doped or free silicon. This may be best achieved by using a wafer prepared by epitaxial growth in boron, provided that the heavy boron doping does not interfere with subsequent electronic device fabrication on the same wafer. When subsequent electronic device fabrication is desirable, the region above the dot-dash line 16 may be rendered highly conductive by ion bombardment, provided a very thin diaphragm (on the order of several microns or less) is desired. If a thicker diaphragm 12 is desired, in excess of 3-5 microns) then normal diffusion techniques can be utilized to provide the desired conductivity. When diffusion or ion bombardment is utilized, only the area of each device in the vicinity of the desired diaphragm need have this special doping provided, leaving the remainder of the wafer undoped so as to permit device fabrication in the usual fashion on silicon.

In the embodiment described with respect to FIGS. 1 and 2, there is a silicon dioxide layer 18, which may be on the order of 0.15 micron thickness. Then, a counter electrode or ground plane 20 may be deposited over the silicon dioxide layer 18. This may preferentially comprise a gold layer, which however may be sandwiched between very thin titanium layers to provide better adhesion between the gold and silicon dioxide and between the gold and the subsequent layer 22 of zinc oxide. The counter electrode layer 20 may extend entirely across any substrate which is not to have electronic devices formed therein, or may be limited to the diaphragm area, as shown. The silicon dioxide layer 18 may provide both chemical and crystallographical isolation between the zinc oxide and the silicon substrate 10. For instance, the silicon dioxide layer 18 can prevent an undesirable solid state reaction between the silicon and the gold which can occur at the deposition temperature (about 325° C.) of the zinc oxide layer 22. The reaction between the gold and silicon degrades the surface of the counter electrode quality, which in turn degrades the surface smoothness and uniformity of crystalline orientation of the zinc oxide. Further, the silicon dioxide layer 18, being an amorphous structure, masks the (100) symmetry of the underlying silicon substrate. This allows reliable growth of the gold counter electrode with a (111) orientation so that the C-axis zinc oxide film 22 can readily be RF diode sputtered under conditions yielding the same three-fold symmetry. In other words, the silicon dioxide isolates the (111) gold counter electrode from the (100) symmetry of the silicon substrate, so that the gold counter electrode serves as a seed for achieving a high quality C-axis zinc oxide crystalline orientation. If used, the titanium layers deposited both before and after deposition of the gold film may be on the order of 300 Angstroms thick. The quality of the surfaces upon which the zinc oxide is grown is significant because the longitudinal acoustic wave propagates only along the zinc oxide C-axis, and any misorientation thereof not only reduces the efficiency in exciting the longitudinal wave, but also allows undesirable shear wave components to be excited, which increases the spurious frequency response and decreases the quality factor (Q) of the resonator.

The zinc oxide film 22 may be RF diode sputtered utilizing a relatively pure (eg., 0.999) zinc oxide target. The wafer or devices being sputtered are side mounted, preferably at a slight angle (such as 36° off the vertical) so as to provide uniformity of average thickness to on the order of 1.5% per centimeter across an overall wafer, which corresponds to a uniformity of 0.3% per centimeter over a single one millimeter square diaphragm 12. It has also been found that sputtering with premixed 20% oxygen/argon ambient and careful pressure control are helpful. For instance, if the oxygen/argon is not premixed, the variations can alter the ultimate characteristics of the device. Furthermore, although devices can readily be sputtered utilizing pressures in the range of $6 \times 10^{-3}$ Torr to $12 \times 10^{-3}$ Torr, the lower pressures tend to make the resulting deposited zinc oxide have high insulative but low piezoelectric qualities and may result in buckling (rippling) of the diaphragm 12. On the other hand, deposition at the higher end of the pressure range ($12 \times 10^{-3}$ Torr) causes the resulting deposited zinc oxide to be highly conductive and have high piezoelectric qualities, and there is much less buckling. Obviously, the properties at the higher pressure are desirable except that the conductivity results in very high insertion losses. Thus, RF diode sputtering in the oxygen/argon ambient at pressures on the order of 8 or $9 \times 10^{-3}$ Torr have been found most desirable. The sputtering is preferentially achieved with the substrate temperature at about 325° C.

In the filter embodiment shown in FIGS. 1 and 2, there are a pair of closely spaced electrodes 24, 25, with corresponding connectors 26, 27 leading to bonding pads 28, 29. The pads 28, 29 should preferably be over the regions 14 where there is sufficient substrate thickness to endure suitable bonding of wires 30, 31 to the pads 28, 29. Additional wires 32, 33 may be bonded to the counter electrode 20 to form ports 34, 35. But the pads 28, 29 and counter electrode 30 may be connected directly to circuits formed on the same substrate, when appropriate. Various processes may be utilized to provide the metallization 24-29, such as chemical etching or lift-off processes. Because it is difficult to find a chemical etch for a suitable metal which is selective with respect to the zinc oxide, it is preferable to use a pattern-developed, photoresist coating, followed by vacuum deposition of about 1500 Angstroms of aluminum, or possibly a few hundred Angstroms of chromium, a thousand Angstroms of aluminum, and a few hundred Angstroms of chromium. The vacuum evaporated Cr-Al-Cr film appears to provide the best electrode definition, allowing the electrodes 24, 25 to be reliably reproduced with about a 2 micron spacing between them. This may provide better coupling between the two resonators of the filter, particularly at higher frequencies (say in excess of 400 MHz). The use of sputtered electrode metallization is also possible; however, it is not preferred because of unreliable pattern definition. Utilizing the processing described hereinbefore, it is possible to provide zinc oxide/silicon diaphragms as thin as 5 or 15 microns (corresponding to fundamental frequencies of about 200-500 MHz) without any diaphragm buckling. Because there is little or no diaphragm buckling, alignment of successive masks is best achieved by accurately positioning the photo masks to reference edges of the waver on which devices are being produced.

If found desirable in any given case, the connectors 26, 27 and the bonding pads 28, 29 may be made thicker (on the order of 5000 Angstroms). However, for maximal frequency, it is desirable to maintain electrodes 24, 25 which are as thin as is compatible with quality assurance, since the fundamental mode will be defined by the distance from the upper surface of the electrodes 24, 25 to the bottom surface of the diaphragm 12. Minimal area of the total metallization 24-29 is desirable in order to reduce parasitic capacitance.

Once the device of FIGS. 1 and 2 has been fabricated, it is possible to fine tune the fundamental mode frequency response of the device in a variety of ways. For instance, ion milling of the bottom side of the silicon diaphragm may be performed through an aperture in the package in which the device is mounted. Since the ion milling process does not perturb the electrical connections made to the electrodes on the zinc oxide side of the resonator, the resulting resonant frequency change can be monitored while the ion milling proceeds. It is possible to reduce, for instance, an 8 micron silicon diaphragm 12 to a 3 micron diaphragm by ion milling to achieve a frequency tuning of over 100 MHz. In fact, the ion milling may provide an even smoother surface than the chemical etch stop process. Alternatively, use of a suitably thick coat of photoresist to protect the zinc oxide surface will permit use of a standard, low temperature etchant to remove a desired amount of silicon from the diaphragm 12, without creating any buckling or other adverse effects. Thus, the frequency can be increased after fabrication and mounting. On the other hand, if desired, the diaphragm 12 can be thickened by vapor depositing a thin metal film on the bottom surface in a well known fashion, while taking suitable precautions known to those in the art, thereby to decrease the frequency of the final device. Placement of acoustic absorbing material at the periphery of the electrodes and the removal of zinc oxide at the periphery of the electrodes (but not between electrodes of acoustically coupled resonators) may serve to enhance the resonance Q factor, reduce unwanted sidelobe response, and/or improve filter efficiency.

Devices of the type described with respect to FIGS. 1 and 2 hereinbefore have been fabricated with zinc oxide layer thicknesses ranging from about 2 microns to 10 microns and silicon diaphragm 12 thicknesses ranging from about 5 microns to 15 microns. The ratio of the thickness of the zinc oxide layer to the silicon diaphragm 12 has been found to be an important criteria. If the zinc oxide and silicon are of about equal thickness, there may be spurious frequencies on both sides of the resonant frequency. If the silicon is thinner than zinc oxide, there are spurious sidelobe responses at frequencies below resonant frequencies; but if the zinc oxide is thinner than the silicon, then the spurious sidelobe responses are at frequencies above the resonant frequency. It has been found that the absolute thickness ratio of zinc oxide to silicon might best be on the order of between 0.3 and 1.0. The normalized thickness, expressed in terms of the acoustic path length, taking into account the different acoustic velocity of the two mediums (the velocity in silicon being approximately 8430 m/sec and that in zinc oxide being about 6300 m/sec) is perhaps a more useful tool. It has been found that normalized acoustic thickness ratios of zinc oxide to silicon on the order of 0.4 to 1.3 are preferred. For maximum inter-resonator coupling in a filter of the type illustrated in FIGS. 1 and 2, normalized zinc oxide/silicon acoustic thickness ratio should be near unity. This can provide effective piezoelectric coupling coefficient between the electrodes 24, 25 of about 0.28. Reducing the thickness of the zinc oxide layer reduces the coupling coefficient. Devices of the type described have been produced with insertion losses in the 5 db-10 dB regime. However, optimization of electrode shaping, and resonator area (which is confined by the related electrode 24, 25 and the lower surface of the diaphragm 12) along with reduction in parasitic series resistance and bonding pad capacitance, should yield devices with insertion loss as low as 2 dB.

Although the embodiment shown in FIGS. 1 and 2 include a pair of resonators defined by the corresponding electrodes 24, 25, it should be understood that a single resonator may be employed, whereby only a single electrode 24 (or 25) would be provided. Also, by suitable design (such as having the connectors 26, 27 parallel to the gap between the electrodes 24, 25, more electrodes could be provided so as to provide a three, four or five pole device, consisting of acoustically coupled resonators, thereby permitting design of multipole filters. The equivalent circuit analysis of devices in accordance with the present invention may be performed utilizing known techniques, such as those described in Rennick, R. C., IEEE Transactions On Sonics And Ultrasonics, October 1973, pp. 347-354.

The device described with respect to FIGS. 1 and 2 heretofore employs zinc oxide on silicon. However, other materials than the zinc oxide may be employed, if desired, within the spirit of the invention. All that is necessary is that the material be highly piezoelectric and have a sufficiently high resistivity. For instance, cadmium sulphide could be employed if desired, although its characteristics are not as well known and defined as those of zinc oxide, and there appears to be no advantage in the resultant processing. Or, aluminum nitride may be employed on silicon, or on an aluminum oxide substrate. For higher frequencies, the high acoustic velocity of aluminum nitride in the layer 22 might be advantageous. And if high temperature is a more paramount consideration than electronic device compatibility, aluminum oxide may be preferred over silicon.

As described hereinbefore, one of the advantages of the invention is that resonators and/or filters may be fabricated on silicon substrates, thereby permitting fabrication of electronic circiuits with frequency-determining elements in the same monolithic substrate. However, where desired for other purposes, the invention may be practiced with other substrate materials.

If desired, gold may be used alone for the reference electrode 20, titanium or perhaps platinum may be used alone if desired. And, the silicon dioxide layer 18 may be eliminated if desired, where the resultant product does not require the advantages thereof. The only thing significant is that there is provided a substrate material having semiconductive, high temperature, or other desired properties, which is readily processed to form a viable thin diaphragm 12, with a counter electrode disposed thereon, and a highly piezoelectric, sufficiently resistive material disposed over the counter electrode, together with one or more metal electrodes thereon. Of course, the piezoelectric material needs to be present only in the region of the wave, between the electrodes 24, 25 and the diaphragm. Similarly, although the invention has been shown and described with respect to exemplary embodiments thereof, it should be understood by those skilled in the art that the foregoing and various other changes, omissions and additions may be made therein and thereto, without departing from the spirit and the scope of the invention.

We claim:

1. A longitudinal, fundamental, bulk mode resonator comprising:
    a substrate having first and second substantially planar surfaces, a portion of said substrate being thinned to provide a membrane having first and second substantially coplanar surfaces separated by a distance of from about three microns to about fifteen microns;
    a metal counter electrode disposed on said substrate with a region of said counter electrode adjacent to said first surface of said membrane;
    a film of low conductivity piezoelectric material having a thickness of from about two microns to about ten microns disposed adjacent said region on a side of said counter electrode opposite to said membrane; and
    a metal top electrode disposed on said film adjacent said region, said top electrode and said counter electrode providing electroacoustic coupling with said film, the distance between a surface of said top electrode opposite to said film and said second surface of said membrane comprising a half wavelength of a desired longitudinal bulk acoustic wave.

2. A resonator according to claim 1 wherein said film is zinc oxide.

3. A resonator according to claim 1 wherein said film is aluminum nitride.

4. A resonator according to claim 1 wherein said substrate is silicon.

5. A resonator according to claim 1 wherein said substrate is aluminum oxide.

6. A resonator according to claim 1 wherein said first surface of said membrane is coated with an isolation layer, and said counter electrode is disposed on said layer.

7. A resonator according to claim 1 wherein said counter electrode comprises a metal selected from the group consisting of gold, titanium and platinum.

8. A resonator according to claim 1 wherein said film has a second top electrode disposed thereon in close proximity with said first named top electrode, both of said top electrodes being adjacent said region to provide a pair of longitudinal, fundamental, bulk mode resonators acoustically coupled together as a filter.

9. A resonator according to claim 1 wherein the ratio of absolute thickness of said film to said membrane is from about 0.3 to about 1.0.

* * * * *